United States Patent
Tang et al.

(10) Patent No.: US 11,184,007 B2
(45) Date of Patent: Nov. 23, 2021

(54) CYCLE BORROWING COUNTER

(71) Applicant: Western Digital Technologies, Inc., San Jose, CA (US)

(72) Inventors: Tianyu Tang, Milpitas, CA (US); Venkatesh prasad Ramachandra, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/814,631

(22) Filed: Mar. 10, 2020

(65) Prior Publication Data

US 2021/0288652 A1   Sep. 16, 2021

(51) Int. Cl.
| | |
|---|---|
| *H03K 21/00* | (2006.01) |
| *H03K 23/58* | (2006.01) |
| *H03K 5/13* | (2014.01) |
| *H03K 23/00* | (2006.01) |
| *H03K 5/00* | (2006.01) |

(52) U.S. Cl.
CPC ............ *H03K 23/588* (2013.01); *H03K 5/13* (2013.01); *H03K 23/00* (2013.01); *H03K 21/00* (2013.01); *H03K 2005/00019* (2013.01)

(58) Field of Classification Search
CPC .......... H03K 5/13; H03K 2005/00019; H03K 21/00; H03K 21/02; H03K 21/026; H03K 23/00; H03K 23/58; H03K 23/588
USPC .................. 377/47, 54, 64, 66, 73
See application file for complete search history.

(56) References Cited

U.S. PATENT DOCUMENTS

| | | | |
|---|---|---|---|
| 3,753,127 A | 8/1973 | Rowe | |
| 4,002,926 A | 1/1977 | Moyer | |
| 4,499,589 A | 2/1985 | Geesen | |
| 5,013,944 A * | 5/1991 | Fischer | ................ H03K 5/131 |
| | | | 327/277 |
| 6,566,918 B1 | 5/2003 | Nguyen | |
| 9,772,648 B2 | 9/2017 | Sheafor | |
| 10,187,082 B1 | 1/2019 | Tee et al. | |
| 2009/0180358 A1 | 7/2009 | Kouzuma | |
| 2017/0102420 A1* | 4/2017 | Jenkins | ................ H03K 5/133 |

FOREIGN PATENT DOCUMENTS

| | | |
|---|---|---|
| DE | 3806981 A1 | 9/1989 |
| WO | 2019173821 A1 | 9/2019 |

* cited by examiner

*Primary Examiner* — William Hernandez
(74) *Attorney, Agent, or Firm* — Volpe Koenig

(57) ABSTRACT

Circuits and systems for generating counter signals are provided herein. A circuit may comprise a shift register having a series of flip-flops. Each of the flip-flops of the series may be coupled to a clock. The shift register may generate a borrowing clock signal using an output of a flip-flop of the shift register, and a transition of the borrowing clock signal may be advanced by a number of clock cycles based on a position of the flip-flop of the shift register. The circuit may further comprise a clock divider circuit having a number of divide-by-N counters and a number of flip-flops. A divide-by-N counter may be coupled to a flip-flop of the shift register, and a flip-flop of the clock divider circuit may be coupled to one of the divide-by-N counters and to the clock.

22 Claims, 15 Drawing Sheets

CYCLE BORROWING COUNTER

FIELD OF INVENTION

The invention relates to counter circuits for digital systems. More specifically, the present invention relates to counters for use in non-volatile memory circuits.

BACKGROUND

In memory devices, it may be desirable to coordinate timing of circuit operations to enhance performance. For instance, a memory circuit performing a read or write operation may receive a clock signal and a data signal. The memory circuit may sample the data signal upon detecting pulses of the clock signal. In some cases, it may be necessary to sample the data signal within a certain timing margin to avoid sampling errors. Such constraints may become increasingly pronounced when sampling data using clock signals that oscillate at higher speeds.

Non-volatile memory devices, such as NAND flash, as well as other types of Read-Only Memory (ROM), may perform read and/or write operations at relatively lower speeds than, for example, the clock speed of a processor or volatile memory such as Random Access Memory (RAM) or Dynamic RAM (DRAM). In some systems, a NAND flash device may receive data signals in concert with such relatively "high-speed" clock signals. Thus, in these systems, it may be advantageous to adjust, correct, or calibrate the timing of a high-speed clock signal such that a pulse is properly detected within the appropriate time window.

Processes for calibration of clock signals may be performed by a memory device using one or more synchronous or asynchronous counter circuits. Counter signals with which to perform the calibration may be generated at varying frequencies. For example, a counter circuit may generate a counter signal by detecting pulses of the clock. Upon detection of a certain number of pulses of the clock signal, a binary counter circuit may transition the counter signal from a high state to a low state, or vice-versa. When implemented in a memory circuit, the counter may be used to gate one or more clock signals, for instance, enabling calibration while the counter signal is in a high state and preventing toggling of the clock signal while the counter signal is in a low state.

Counter types include both synchronous and asynchronous counters. A synchronous counter may have multiple stages configured in a parallel arrangement, such that each stage of the synchronous counter accepts the clock signal as an input, and each generates a counter signal at a different frequency. Given that each parallel counter stage directly measures pulses of the clock, each stage of the synchronous counter may introduce the same amount of propagation delay with respect to the clock signal. An asynchronous counter may similarly generate counter signals at varying frequencies using successive stages. In this case, the stages may have a serial arrangement, meaning only the first stage of the asynchronous counter uses the clock input and subsequent stages generate counter signals by detecting pulses of a preceding counter stage. Each successive stage of the asynchronous counter may introduce additional propagation delay.

The type and design of such a counter may be specific to each implementation. For example, in addition to having compatibility with a high-speed clock, which may impose additional constraints on the level of acceptable propagation delay, it may be desirable to use a counter that introduces minimal delay from a clock impulse and generates signals having a consistent amount of delay. Due to power and space constraints in certain circuits, it may also be impractical to use synchronous counters. Thus, a counter that requires relatively little power, has a low space footprint, and offers flexibility when gating a high-speed clock signal is desired.

SUMMARY

Circuits and systems for generating counter signals are provided herein. A circuit may comprise a shift register having a series of flip-flops. Each of the flip-flops of the series may be coupled to a clock. The shift register may generate a borrowing clock signal using an output of a flip-flop of the shift register, and a transition of the borrowing clock signal may be advanced by a number of clock cycles based on a position of the flip-flop of the shift register. The circuit may further comprise a clock divider circuit having a number of divide-by-N counters and a number of flip-flops. A divide-by-N counter may be coupled to a flip-flop of the shift register, and a flip-flop of the clock divider circuit may be coupled to one of the divide-by-N counters and to the clock.

DETAILED DESCRIPTION OF THE PREFERRED EMBODIMENTS

Embodiments described herein include methods, circuits, apparatuses, devices, and systems for generating a counter signal that is synchronous with an internal clock. In the following embodiments, the clock signal may be referred to as a "reference" clock signal, a "raw" clock signal, an "input" clock signal, or a "CLK." The terms "pulse," "clock pulse," "edge," or "transition" as used herein may refer to to the same thing. In addition, the terms "rising edge" and "low-to-high transition" may refer to the same thing, as may the terms "falling edge" and "high-to-low transition." As used throughout the description that follows, these terms may be used interchangeably. Furthermore, in any of the embodiments described herein, a clock generator may generate a single-ended signal or a pair of differential signals, each of the differential signals complementing each other. For instance, when one of the two differential signals transitions to a high state, the other simultaneously transitions to a low state.

The term "clock-to-output delay" may be used to refer to propagation delay, or gate delay, which may be the time required for a data pulse to travel from the input of a logic gate to the output of the logic gate. Clock-to-output delay may be understood in absolute terms of a time value (i.e., in nanoseconds or picoseconds). Within a given pathway in a circuit, propagation delay may vary depending on several additional factors such as temperature, supply voltage, and/or load capacitance. Thus, it may be impractical to calculate or anticipate a specific amount of propagation delay along a given signal path. In some embodiments, the clock-to-output delay of a circuit it may be understood in relative terms. For example, it may be assumed that is less than a given number of clock cycles (e.g., one or one-half clock cycles).

A synchronous or asynchronous counter may be a divide-by-N counter. A divide-by-N counter may accept an input clock signal and generate a derivative signal. This may be accomplished by dividing the frequency of the input clock signal by a division factor, N. In a rudimentary example, where N=2, and an input clock signal has a frequency of f, a divide-by-2 counter may generate a counter with a frequency of f/2.

Figure 1:
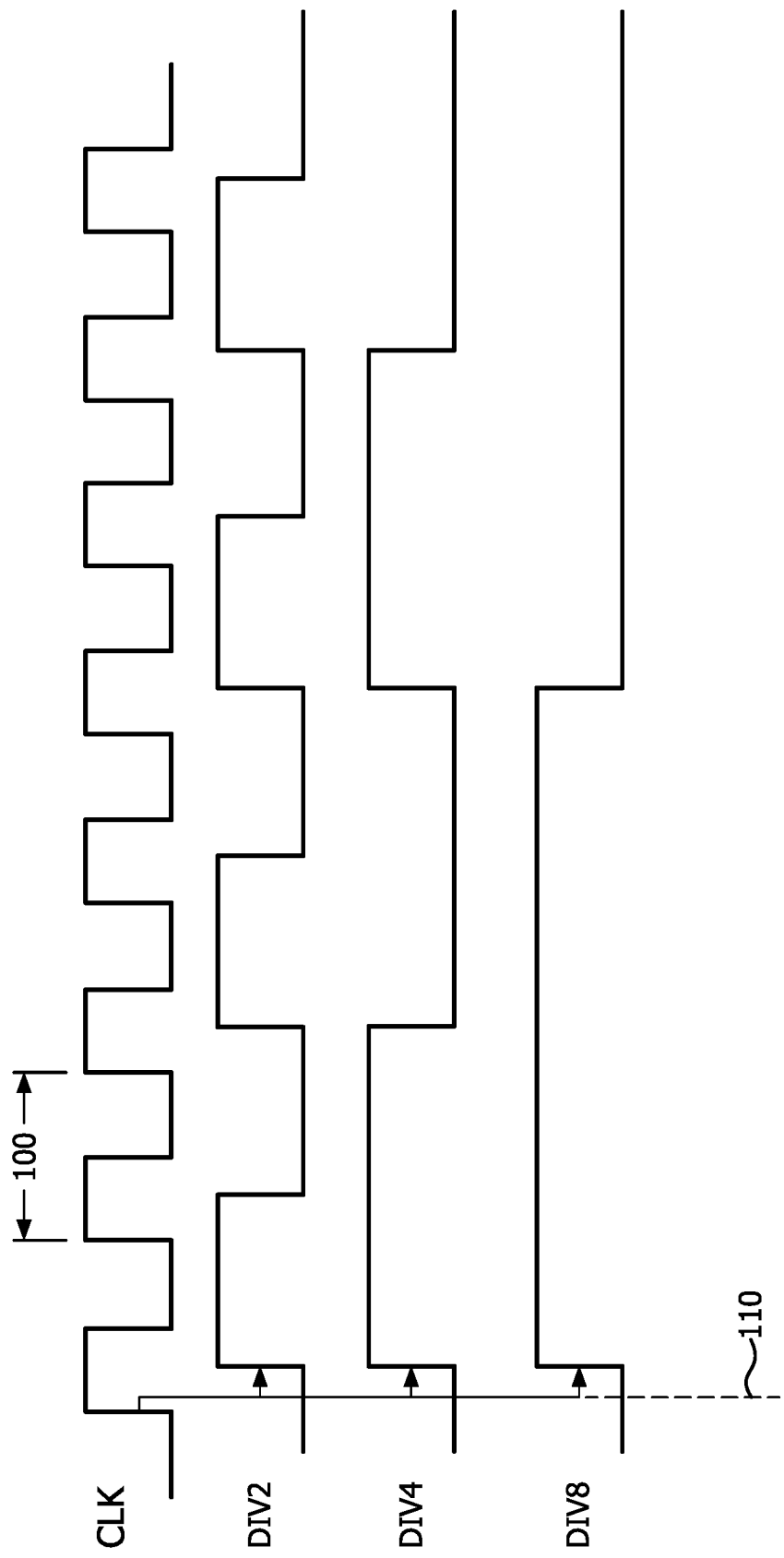
FIG. 1 shows an example timing diagram for a circuit in which a plurality of synchronous divide-by-N counters are generated from a raw clock signal.

FIG. 1 shows an example timing diagram for a circuit in which a plurality of synchronous divide-by-N counter outputs is generated from a raw clock signal. A raw clock signal CLK may be given with a period 100. As shown, the circuit of FIG. 1 may implement a plurality of divide-by-N counters DIV2, DIV4, and DIV8. DIV2 may be a divide-by-2 signal, DIV4 may be a divide-by-4 signal, and DIV8 may be a divide-by-8 signal. Accordingly, DIV4 may have a frequency half that of DIV2, and DIV8 may have a frequency half that of DIV4. Each divide-by-N counter may take the raw, high-speed clock signal as its clock input. As shown in FIG. 1, each output may share a same clock-to-output delay 110.

In other embodiments, a series of divide-by-N counters may be given in which N is different for some or all of the counter signals. For example, a first counter may output a divide-by-2 counter signal, while a second counter may output a divide-by 4 counter signal. In this case, the divide-by-2 counter signal may have a frequency half that of the raw high-speed clock, while the divide-by-4 counter signal may have a frequency one-quarter that of the high-speed clock. Depending upon the configuration of the circuit, the clock-to-output delay may be different for each synchronous counter having a different value N.

In some embodiments, the raw clock signal 110 may oscillate between high and low levels at a given frequency depending upon the implementation. For example, in a NAND flash implementation, a high-speed raw clock signal may have a period between 1 and 1.5 nanoseconds. For other types of memory or circuits generally, such as RAM, DRAM, synchronous DRAM (SDRAM), or where the clock signal is output from a computer processor, the frequency may be significantly higher. The raw clock signal has a duty cycle, which may be defined as the proportion or percentage of one period that a clock signal is at high level. The duty cycle may be a ratio of the width of a clock pulse in a single cycle to the total duration of the clock cycle. As shown in FIG. 1, the clock may have a duty cycle of 50%, though in other embodiments, the duty cycle may be lower or higher.

Figure 2:
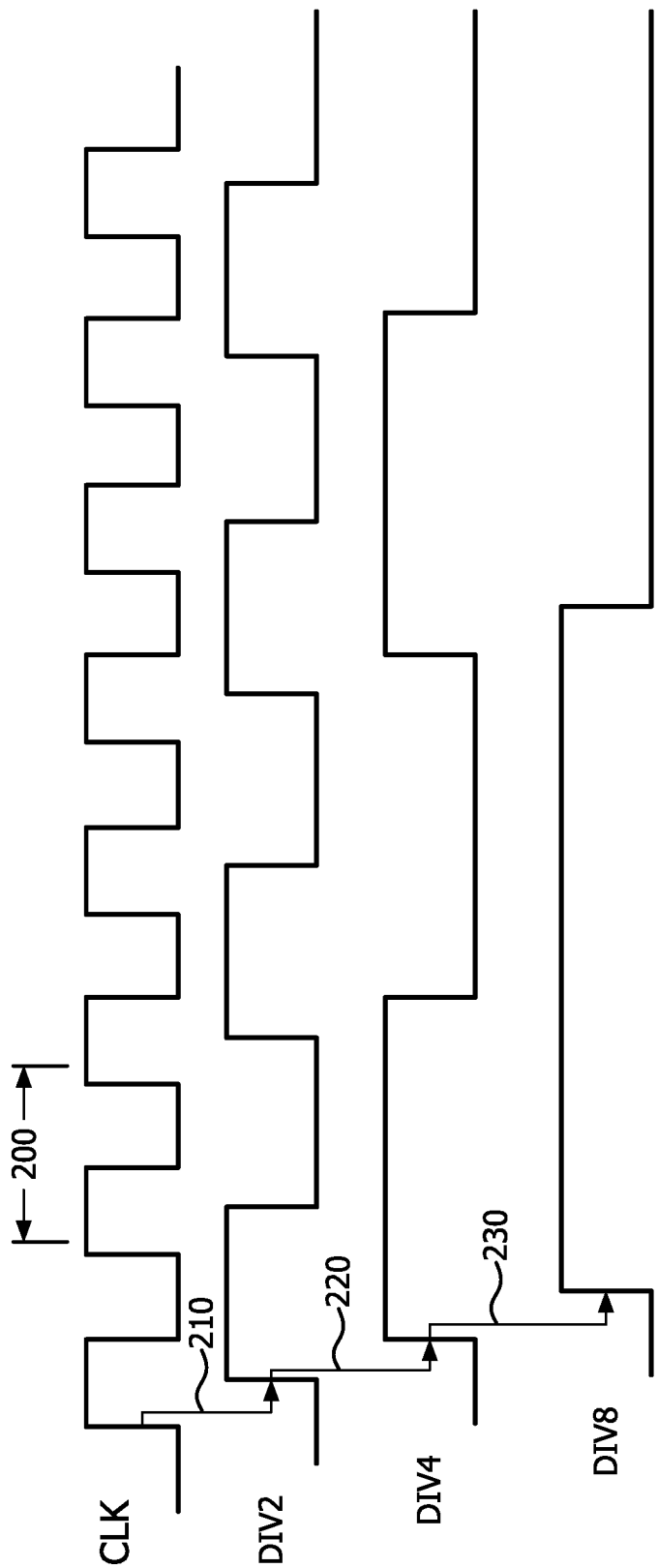
FIG. 2 shows an example timing diagram for a circuit in which a plurality of asynchronous divide-by-N counter outputs are generated based on a raw clock signal.

FIG. 2 shows an example timing diagram for a circuit in which a plurality of asynchronous divide-by-N counter outputs are generated based on a single clock signal. Similarly, as shown in FIG. 1, the raw clock signal CLK may oscillate at a high frequency, and as such, cycle 200 may be in a range, for example, of 1 to 1.5 nanoseconds. The circuit exemplified in FIG. 2 may generate a plurality of divide-by-N counter signals DIV2, DIV4, and DIV8. DIV2 may be a divide-by-2 signal, DIV4 may be a divide-by-4 signal, and DIV8 may be a divide-by-8 signal. Accordingly, DIV4 may have a frequency half that of DIV2, and DIV8 may have a frequency half that of DIV4.

As shown in FIG. 2, counter signals DIV2, DIV4, and DIV8 may be asynchronous with respect to CLK. For example, the counter stages may be arranged in a ripple configuration such that each successive counter takes the output of a previous counter as its clock input. As shown, a first divide-by-2 counter may take signal CLK as an input in order to generate DIV2. A second divide-by-2 counter may take the first DIV2 signal as an input in order to generate a DIV4 signal, and a third divide-by-2 counter may take the output DIV4 as an input, subsequently generating DIV8. Each divide-by-2 counter may introduce another instance of clock-to-output delay, shown by 210, 220, and 230. DIV4 may have a frequency half that of DIV2, and DIV8 may have a frequency half that of DIV4.

For embodiments implementing an asynchronous counter, a series of divide-by-N counters may be given in which N is different for all or some of the counter signals. For example, a first counter may output a DIV2 counter signal, while a second counter may output a DIV4 counter signal. In this case, the DIV2 counter signal may have a frequency half that of the raw high-speed clock, while the DIV4 counter signal may have a frequency one-quarter that of the high-speed clock. Depending upon the configuration of the circuit, the values of clock-to-output delay may be different for each counter circuit having a different frequency division factor N.

In a digital circuit, it may be desirable to generate a counter with which to gate one or more clock or data signals. One potential implementation may be in a setup and hold time calibration process. For example, in an exemplary system, a sending circuit may send both a data signal and a clock signal to a receiving circuit. The receiving circuit may identify values of the data signal in response to detecting transitions of the clock signal.

Ideally, clock transitions may occur at optimal times, enabling the receiving circuit to sample values of the data signal correctly. In some circumstances, however, a transition time of the clock signal may deviate from an optimal transition time (e.g., the clock signal may transition more slowly than is desirable). This may cause the receiving circuit to identify values of the data signal incorrectly, causing sampling errors. The deviation of the clock signal transition from the optimal transition time may be referred to as "skew." When a clock signal oscillates at a high frequency, the detrimental effect of skew on the receiving circuit's ability to read data values may grow. A skew correction process may involve, for example, first detecting a number of sampling errors and subsequently delaying the clock signal such that subsequent clock transitions occur at optimal times.

In some embodiments, a counter signal may be used to trigger sampling of the clock and/or data signals during the skew correction process. A counter signal may have a fixed toggling time period and a fixed stable time period. A counter signal may remain at a high value for the duration of a fixed toggling time period, enabling other signals gated by the counter signal to oscillate. By contrast, a counter signal may remain at a low value for the duration of a stable time period, disabling other signals gated by the counter signal. Accordingly, a high value of the counter signal during the fixed toggling time period may allow sampling of the original clock signal or a delayed clock signal, whereas during a low value of the counter signal during the fixed stable time period, various operations, including comparisons of the input data and read data may be made, and clock delay values may be adjusted based on, for example, a number of sampling errors.

Figure 3A:
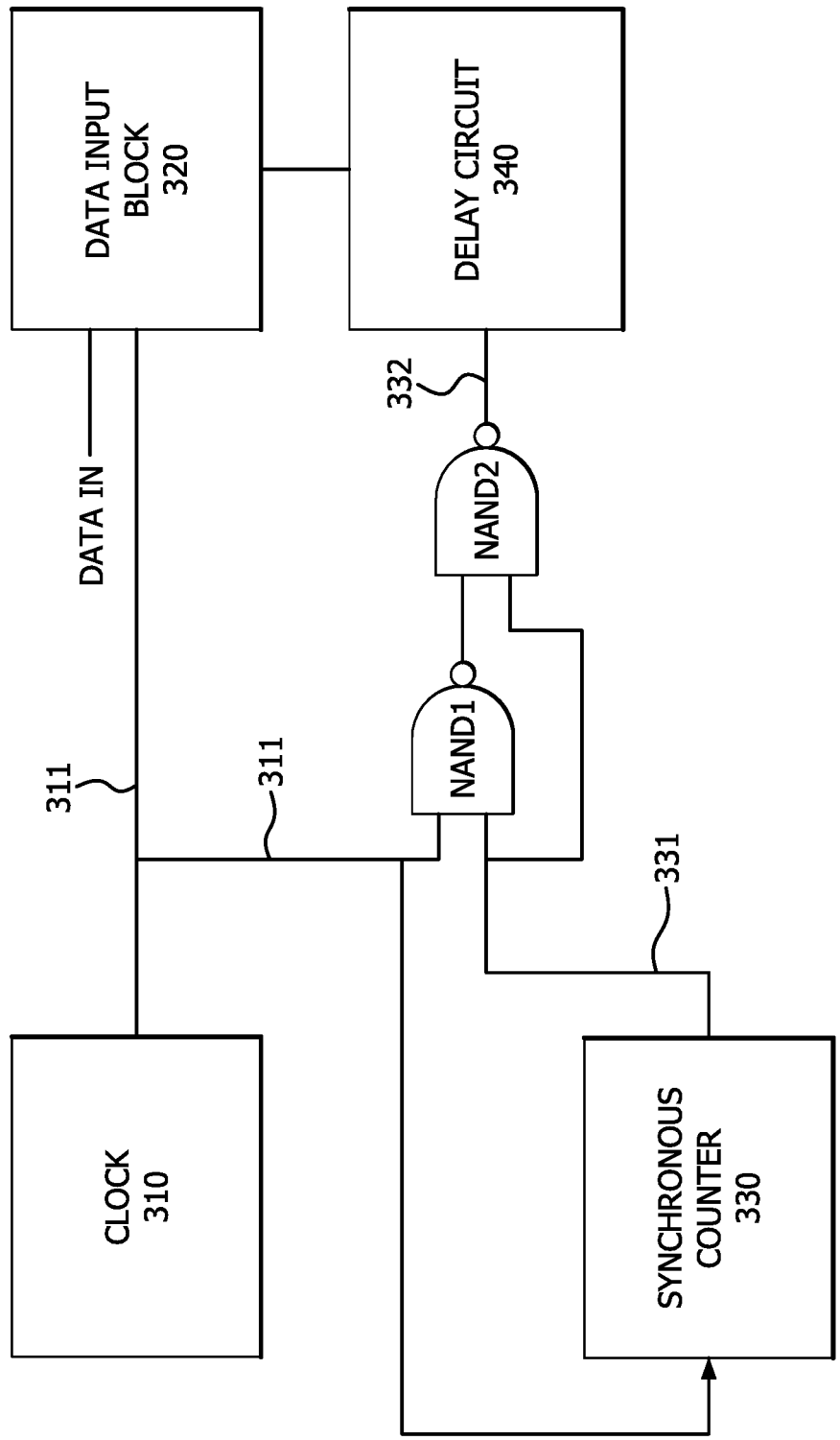
FIG. 3A is a system configured to perform a process for skew correction, the system implementing a synchronous counter circuit.

FIG. 3A shows an example of a synchronous counter as may be used in a variety of circuits including the skew correction process described above. As shown, a high-speed clock 310 may output a clock signal (CLK) 311. In some embodiments, such as NAND flash memory, CLK may be a data strobe signal, DQS, or an inverted data strobe signal, BDQS. A data strobe signal may refer to a signal for time reading that is output together with a data signal. A data input block 320 may accept both the clock signal 311 and one or more data inputs. Additionally, a synchronous counter circuit 330 may accept the high-speed clock signal and output a counter signal 331.

A circuit as depicted in FIG. 3A may include a series of gates NAND1 and NAND2 which gate the high-speed clock signal 311 using the counter signal 331. It may be appreciated that, in other embodiments not depicted, another configuration of logic gates equivalent to the series of gates NAND1 and NAND2 may be implemented. In the example shown, NAND1 may be configured to receive both the raw high-speedclock signal 311 and the synchronous counter signal 331. NAND2 may be configured to receive an output signal of the NAND1 gate and the synchronous counter signal 331. The output 332 of the gated clock signal from NAND2 may then be received by a delay circuit 340, which may include a plurality of delay chains coupled to a bypass signal. The delay circuit 340 may receive and delay the signal 332 to generate an output, which may be received by the data input block 320. The data input block may include circuitry configured to perform the sampling processes of the skew correction process, measuring the number of errors that occur when the data signal is read upon transitioning of the clock signal. The delay circuit 340 may be adjustable, such that the timing of the gated clock signal may be adjusted dynamically, for example, at periodic intervals or upon toggling of an enabling signal, before being received by the data input block 330. This may allow the setup and hold time to be calibrated, ensuring the clock signal transitions occur at desired times.

Figure 3B:
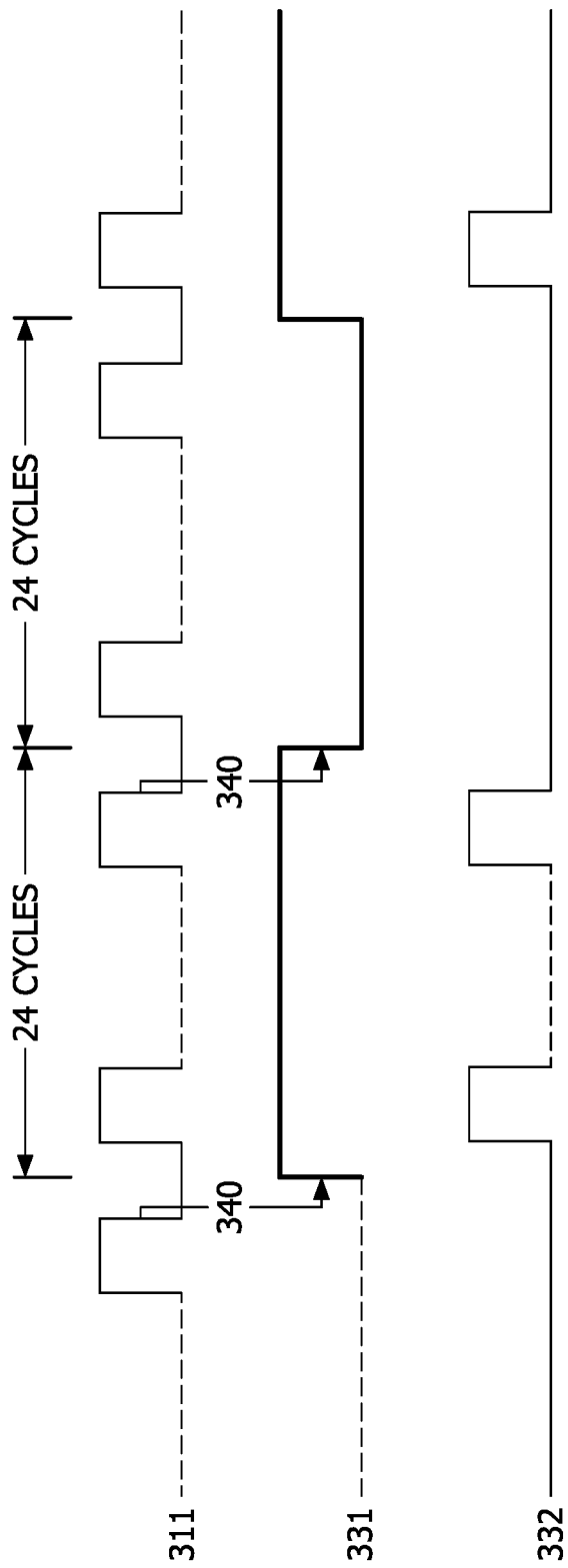
FIG. 3B is a timing diagram showing the clock, counter outputs, and gated clock outputs of the circuit shown in FIG. 3A.

FIG. 3B is a timing diagram showing the clock, counter outputs and gated clock outputs of the circuit shown in FIG. 3A. As shown in FIG. 3B, the raw high-speed clock signal 311 received as an input at the synchronous counter circuit 330 and NAND1 gate may have the same timing. In some embodiments, the clock signal 311 may have a duty cycle of 50%. Alternatively, the duty cycle of the clock signal may be higher or lower depending on the configuration of the circuit.

As shown in FIG. 3B, the counter signal 331 may be a DIV48 counter signal. Accordingly, the high value of the counter signal may persist for a period of 24 cycles of the raw high-speed clock signal 311, and the low value of the counter signal 331 may persist for a period of 24 cycles of the raw high-speed clock. This configuration may enable NAND gates 1 and 2 to generate the output signal 332 by gating clock signal 311 during this period. Thus, the output signal 332 may have a toggling period of 24 cycles and a stable period of 24 cycles for a total period of 48 raw clock cycles.

As shown in FIG. 3B, the total period of the counter signal cycle may be 48 raw clock cycles. In other embodiments, the overall synchronous counter cycle period may be shorter or longer. In other embodiments, the toggling period and the stable period may be shorter or longer, and they need not have the same length. Depending upon the configuration of the circuit, a divide-by-N counter may be implemented with a value of N equal to an integer of two or greater.

In some embodiments, the counter signal 331 derived from the high-speed clock 311 may have a duty cycle of 50% as shown in FIG. 3B. Alternatively, the duty cycle of the counter signal may be higher or lower depending on the configuration of the circuit.

As shown in FIG. 3B, the synchronous counter signal 331 may be generated based on a high-to-low transition, of clock signal 311. Due to the configuration of combination logic in the synchronous counter circuit 330, the synchronous counter signal 331 may have a clock-to-output delay 340. The clock-to-output delay for the synchronous counter circuit 330 may be such that the toggling period of the counter signal 331 commences prior to the next low-to-high transition of the clock signal 311. This may permit the counter signal 331 to properly gate the clock signal 311 and generate signal 332.

In another embodiment, the clock-to-output delay of a counter circuit, and/or the frequency of a clock signal may be such that the toggling period of the counter signal does not commence soon enough to properly gate the clock signal. For example, a timing margin may restrict the usage of the high-speed clock in conjunction with the counter circuit. The gating timing margin may define a period of a gating signal within which a clock transition must occur in order for a receiving circuit to properly read a value of the gating signal. This may be due to setup and/or hold times of the clock signal, which specify periods prior to and subsequent to a clock transition during which the counter signal must be held stable. A timing margin may be expressed in terms of a clock cycle or a fraction of a clock cycle. For instance, the timing margin may have a length of 12 of a clock cycle.

Embodiments described herein may involve using an asynchronous counter to generate a signal having a desired frequency while still meeting the timing margin requirements of the layout. For example, in an implementation where a toggling period of a counter need not commence immediately, an asynchronous counter may permit reconfiguration of the clock and/or counter signals such that gating timing margins may be met.

Figure 4A:
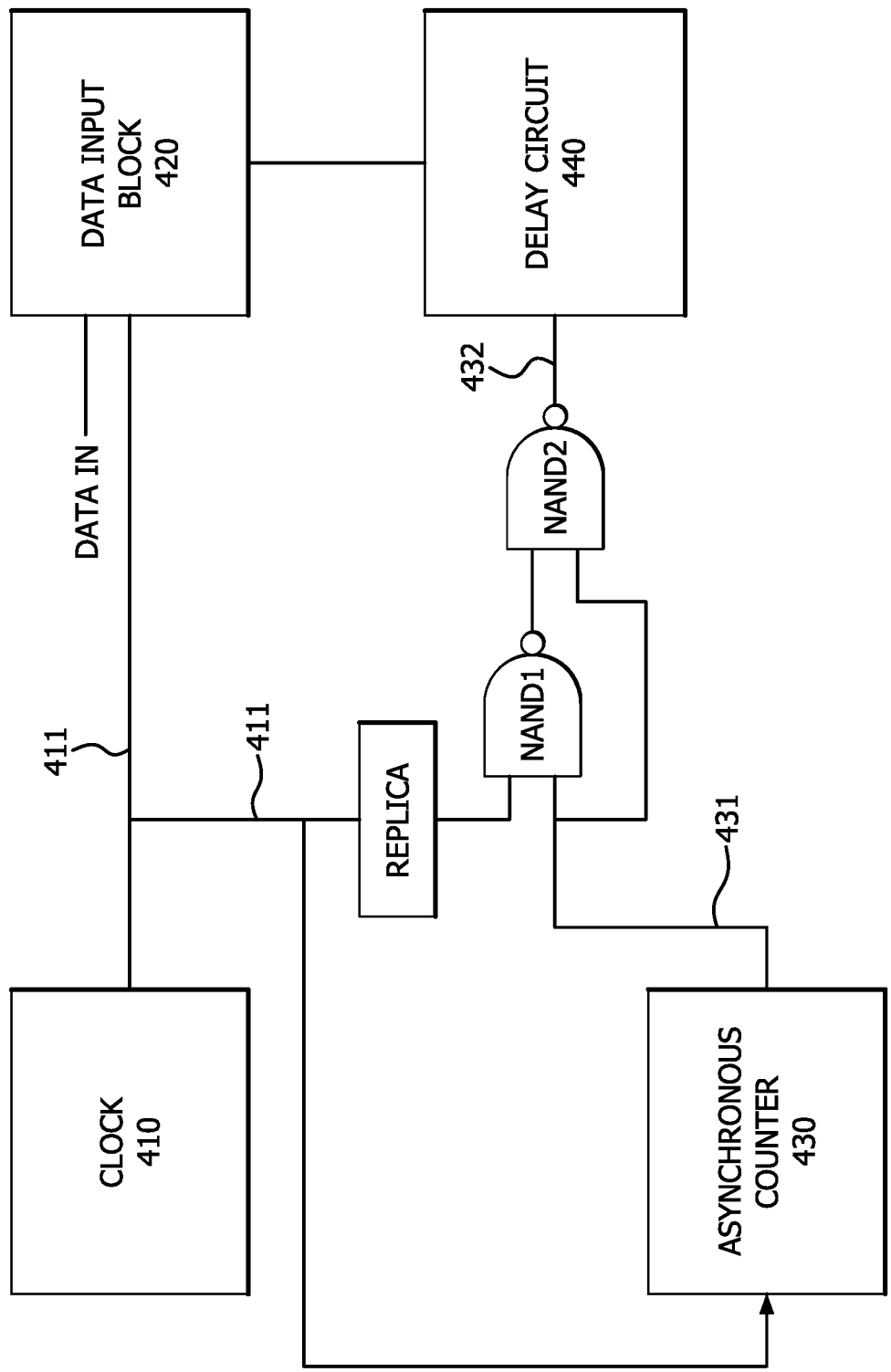
FIG. 4A is a system configured to perform a process for skew correction, the system implementing an asynchronous counter circuit.

FIG. 4A shows an example of an asynchronous counter circuit implemented in the skew correction process described above. As shown, a high-speed clock 410 may output a clock signal 411. A data input block 420 may accept both the clock signal 411 and one or more data inputs. The asynchronous counter circuit 430 may accept the high-speed clock signal 411 and output a counter signal 431. The asynchronous counter may include one or more divide-by-N stages, each stage having the same value N. Alternatively, the value N may be different for each successive stage of the asynchronous counter. Each stage may take the output of the previous stage as its input.

Clock-to-output delay may be introduced along the path from the raw clock signal 411 to the asynchronous counter signal output 431. If the asynchronous counter circuit 430 includes multiple divide-by-N stages, each stage having the same N value and each stage taking the output of the previous stage as its input, the overall clock-to-output delay observed at the final asynchronous counter output may be a multiple of the value of the clock-to-output delay for a single divide-by-N stage. Alternatively, the value N may be different for each successive stage of the asynchronous counter, resulting in varying clock-to-output delay values for each stage.

Similar to the circuit depicted in FIG. 3A, the circuit depicted in FIG. 4A may include a series of gates NAND1 and NAND2 with which to gate the high-speed clock based on the asynchronous counter signal 431. It may be appreciated that, in other embodiments not depicted, another configuration of logic gates equivalent to the series of gates NAND1 and NAND2. Due to the additional clock-to-output delay introduced by the multiple divide-by-N stages of the asynchronous counter, the raw high-speed clock signal and the asynchronous counter signal 431 may be out of sync. According to any of several embodiments discussed later herein, additional delay may be introduced along the path between the raw high-speed clock and the input of the NAND1 gate, resulting in an adjusted high-speed clock signal 415. Alternatively, the asynchronous counter signal 431 may be aligned by way of cycle borrowing, also described later herein.

Figure 4B:
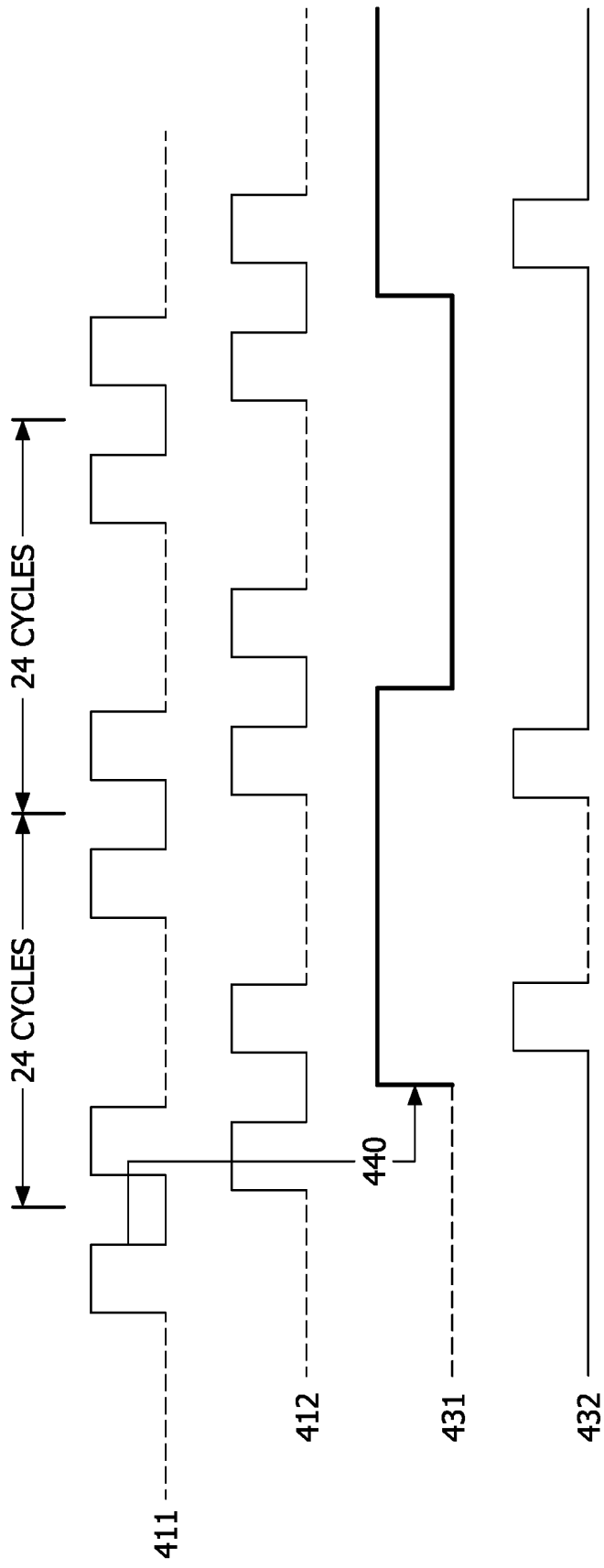
FIG. 4B is a timing diagram showing a raw clock signal, adjusted clock signal, asynchronous counter signal, and gated clock output of the system shown in FIG. 4A.

Assuming the asynchronous counter signal 431 is aligned with the raw clock signal 411 via one of the methods mentioned above, the signal of the asynchronous counter may be used to gate the raw clock. For example, NAND1 may be configured to receive both the adjusted high-speed clock signal 411 and the asynchronous counter signal 431. NAND2 may be configured to receive an output signal of the NAND1 gate and the asynchronous counter signal 431. As shown in FIG. 4B, the output of the gated clock signal from NAND2 may be received by an adjustable delay circuit, which may include a plurality of delay chains coupled to a bypass signal. Such circuitry may provide skew adjustment functionality as discussed in previous embodiments. The adjustable delay circuit 440 may receive and delay the input signal to generate an output, which is received by the data input block 420 along with a data input signal.

FIG. 4B is a timing diagram showing the raw clock signal 411, the adjusted clock signal 412, the asynchronous counter signal 431, and the gated clock output 440 of the circuit shown in FIG. 4A.

In embodiments as shown, the clock signal 411 may have a duty cycle of 50%. Alternatively, the duty cycle of the clock signal may be higher or lower depending on the configuration of the circuit.

As shown in FIG. 4B, the asynchronous counter signal 431 may be a DIV48 counter signal. Depending upon the configuration of the circuit, a divide-by-N counter with a different value N may be implemented. As shown, the total period of the counter signal cycle may be 48 adjusted clock cycles. In other embodiments, the overall counter cycle period of the asynchronous counter may be greater or lower. Also, as shown in FIG. 4B, the counter signal 431 derived from the high-speed clock signal 411 may have a duty cycle of 50%. Accordingly, the high value of the counter signal may persist for a period of 24 cycles of the adjusted high-speed clock signal 412, and the low value of the counter signal 431 may persist for a period of 24 cycles of the adjusted high-speed clock. In alternative embodiments, the duty cycle of the counter signal 431 may be higher or lower depending on the configuration of the circuit.

In a circuit such as that depicted in FIGS. 4A and 4B, a gating timing margin may restrict the usage of a high-speed clock in conjunction with a counter circuit. The gating timing margin may define a period of a gating signal within which a clock transition occurs in order for a receiving circuit to properly read a value of the gating signal. As shown in FIG. 4B, a timing margin may be given in terms of a clock cycle or a fraction of a clock cycle. For instance, the timing margin may have a length of 12 of a clock cycle.

Embodiments directed to generating an asynchronous counter signal that is synchronous with a raw clock signal are described herein. In such embodiments the asynchronous counter signal may be synchronous with the raw clock signal in the sense that the clock-to-output delay from a transition of the clock signal is the same or similar in length as the clock-to-output delay of a synchronous counter circuit configured to generate the same counter signal. Additionally, the clock-to-output delay introduced by the implemented circuit may be consistent, even for circuits generating outputs at different frequencies. In other words, it may be said that the asynchronous counter signal is "aligned" with the raw high-speedhigh-speed clock.

The raw clock signal and the asynchronous counter signal may be aligned by adjusting the raw clock signal or asynchronous counter signal. This may be accomplished, for example, by adding delay along one or both signal pathways. In one embodiment, for adjusting the raw clock signal, one or more digital buffers may be used to replicate the propagation delay introduced in the asynchronous counter due to the plurality of divide-by-N stages. In such a solution, the delay replica may be configured using a chain of inverter gates of varying sizes and having various delay values.

Figure 5:
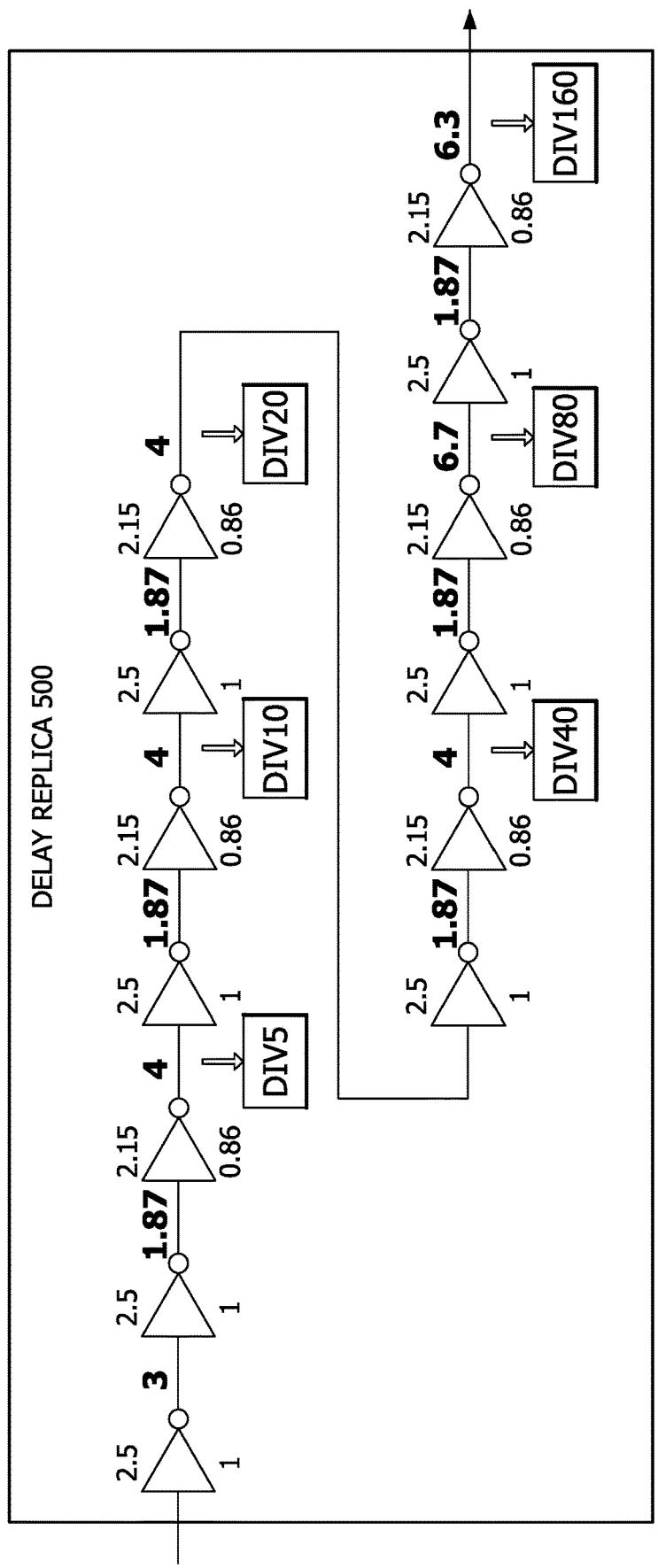
FIG. 5 is a representation of a delay replica shown with outputs at stages configured to match the delay values of various divide-by-N signals.

FIG. 5 depicts a representation of a delay replica shown with outputs at stages configured to match the delay values of various divide-by-N signals. As shown, delay replica 500 is a circuit comprising six such stages. For a first stage, the delay replica 500 may have three inverters configured to match the clock-to-output delay of an asynchronous counter that outputs a DIV5 signal. For a second stage, another two inverters may be configured to generate delay corresponding to a DIV5 asynchronous counter output. Various subsequent configurations of inverters may be given to generate delay corresponding to DIV40, DIV80, and DIV160 asynchronous counter outputs.

As shown in the example of FIG. 5, each of the inverter gates may be a CMOS inverter having complimentary p-type and n-type MOSFETS, PMOS and NMOS. Each inverter may be configured with a beta ratio defined as a size of the PMOS divided by a size of the NMOS, for example, 2.5/1 or 2.15/0.86 as shown. A CMOS inverter may also have a given fan-out value, which may refer to a number of gates that are driven by the inverter with respect to a strength of a gate driving the inverter. Fan-out values corresponding to the three inverters of the DIV5 delay stage are depicted, by way of example, as 3, 1.83, and 4 in FIG. 5. The delay value may depend upon the configured beta ratio and fan-out values, and accordingly, it may be necessary to carefully size the PMOS and NMOS and configure a delay chain with an appropriate number of gates to introduce the desired amount of delay.

In certain implementations, as discussed generally in paragraphs above, it may be difficult to predict the amount of propagation delay to be introduced by a delay replica. Furthermore, due to the potential complexity of the delay replica (i.e., the large number of inverters that may be needed) it may be difficult to precisely determine the configuration in order to simulate this amount of delay. Thus, in some cases, another solution that offers greater flexibility and simplicity may be desirable.

Embodiments directed to generating an asynchronous counter output that is synchronous with a raw clock signal are described herein. In a solution, a circuit may accomplish this by using a shift register to generate a base borrowing clock with a predetermined frequency. A clock divider having one or more stages of divide-by-N counters may be used to derive counter signals from the base borrowing clock at subsequent target frequencies. Each divide-by-N counter stage may intrinsically introduce clock-to-output delay. The length of clock-to-output delay may be in terms of a cycle of the raw clock. For example, it may be assumed that the clock-to-output delay is less than one clock cycle or one-half of a clock cycle. The raw clock may generate a single-ended signal or differential signals that are complementary to each other, and circuitry components described herein that are configured to read a transition of the clock signal may read the single-ended signal or either of the two differential signals.

Figure 6A:
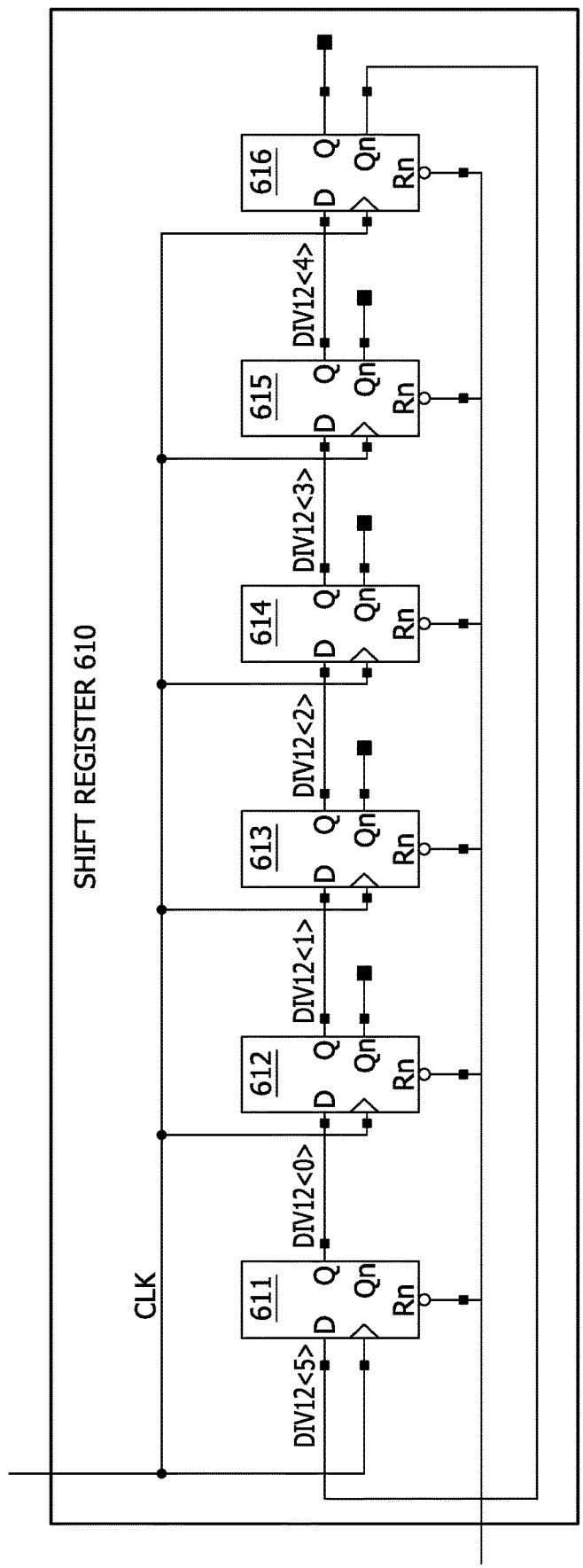
FIG. 6A is a circuit diagram of a shift register configured to generate a DIV12 base borrowing clock signal.
Figure 6B:
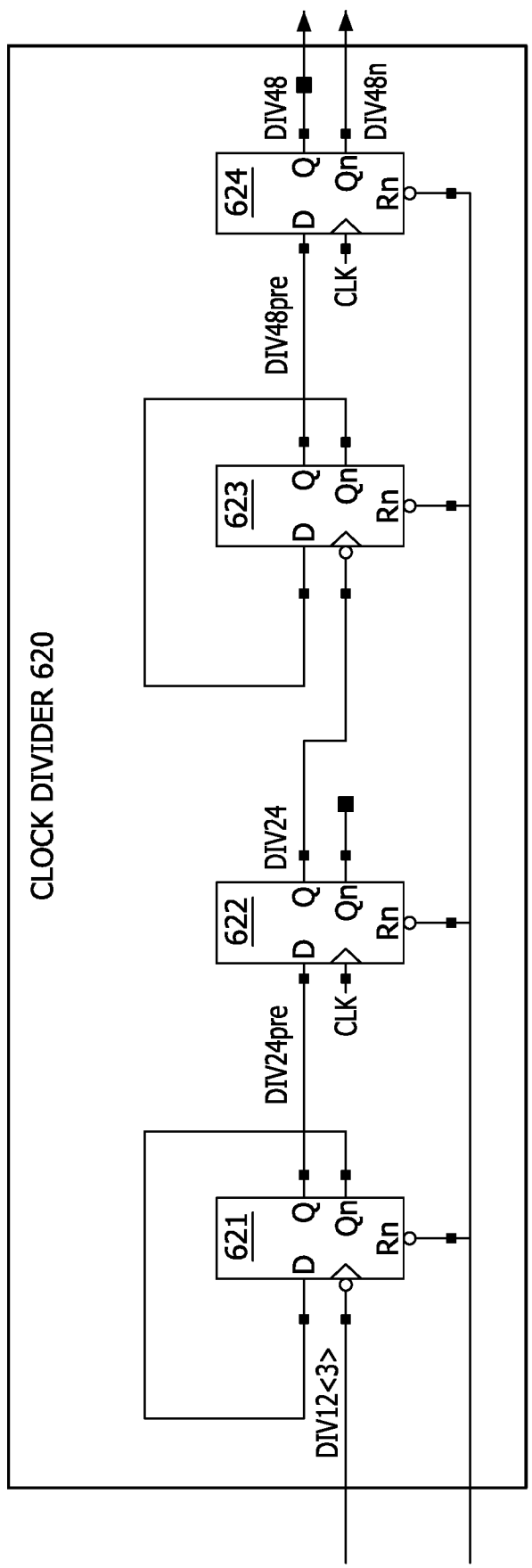
FIG. 6B is a circuit diagram of a clock divider circuit as may be configured to generate a DIV48 counter signal using a selected output of the shift register.

FIGS. 6A and 6B are diagrams showing one example configuration used to generate a DIV48 counter signal that is synchronous with a high-speed clock. Specifically, FIG. 6A shows an example of a shift register 610 configured to generate, from a raw clock signal, a DIV12 base borrowing clock signal. The shift register 610 may have a plurality of flip-flops 611, 612, 613, 614, 615, and 616. As shown, each flip-flop may be driven by the raw clock signal CLK, and thus, their outputs may be said to be synchronous with one another. Each flip-flop may be a D-flip-flop configured with a binary input D and binary outputs Q and $Q_n$. The flip-flops may be arranged in a serial-input serial-output fashion such that each successive flip-flop takes the output Q of a previous flip-flop in the series as an input, D. As shown, each flip-flop of the shift register 610 may transfer input data D to its output Q on a rising edge of the clock signal CLK. Furthermore, the first flip-flop 611 of the series may also take the complement, $Q_n$, of the output of the final shift register 616 as its input D, as in a ring, twisted ring, or Johnson counter configuration. For embodiments implementing a ring, twisting ring, or Johnson counter configuration, it should be emphasized that the raw clock signal CLK may be fed to each flip-flop of the series, distinct from a ripple carry counter configuration in which each flip-flop accepts an output of a previous flip-flop as its clock input. As shown, each flip-flop may also have a reset signal input, Rn, with which the output of the flip-flop may be set to a set or reset state irrespective of the input D or clock signal. In embodiments not depicted, each flip-flop may have an initialization input as an alternative to the reset signal input or in addition to the reset signal input.

It may be assumed that an initialized Q value for all flip-flops is 0. Starting on arrival of a first clock pulse, and continuing for the first six clock pulses, a $Q_n$ output of 1 may be fed from flip-flop 616 to the input of flip-flop 611. Upon arrival of a second clock pulse, flip-flop 611 may pass the output Q value 1 to the input D of flip-flop 612. Flip-flop 612 may subsequently pass the same to flip-flop 613 upon the third clock pulse, and flip-flops 614 and 615 may follow suit in a similar fashion. In this example, after six clock pulses, the value Q at all flip-flops is 1.

Starting upon arrival of a seventh clock pulse, and continuing until arrival of a twelfth clock pulse, a $Q_n$ output of 0 may be fed from flip-flop 616 to the input of flip-flop 611. Advancement of the shift register may occur substantially as described above such that the pattern is repeated upon arrival of a thirteenth clock pulse.

As may be observed, due to the cyclical nature of the twisted ring counter configuration, a series of n flip-flops may be used to generate a base borrowing clock with a period of 2n. In alternative embodiments, the shift register may have a straight serial configuration, instead simply passing the output of a first flip-flop to the next without cycling of the inputs from the final flip-flop of the series.

FIG. 6B further shows an example configuration of the clock divider circuit as may be configured to generate a DIV48 counter signal using a selected output of the shift register 610. Clock divider 620 may include a series of divide-by-2 counters 621 and 623 and flip-flops 622 and 624. In the examples given, it may be assumed that the clock-to-output delay for each stage of division is equal to or less than a length of one raw clock cycle. In some embodiments, the clock-to-output delay introduced by each of the flip-flops may also be greater than one half-cycle, providing a predictable window of time at which the clock divider circuit may be configured to commence or cease toggling of the raw clock. In embodiments as shown, the counters 621 and 623 and flips flops 622 and 624 may each have a reset signal input, Rn, and/or an initialization signal input with which their outputs may be set to a set or reset state irrespective of the input D or clock signal.

In order to adjust the timing of the final output signal of the asynchronous counter, the clock divider 620 may "borrow" cycles from the base borrowing clock generated by the shift register 610. Given that the shift register 610 generates a DIV12 signal and a DIV48 counter signal is desired, it may be determined that two divide-by-2 stages are needed. As each stage may introduce one instance of clock-to-output delay, two cycles may need to be borrowed. This may be accomplished, for example, by configuring the clock divider to accept an output signal of a particular flip-flop in the shift register. By default (i.e., where the DIV12 signal is to be used without borrowing) the output of the final flip-flop of the shift register may be used to drive the clock divider. For a DIV12 signal as shown, which has a period of twelve raw clock cycles, the first transition of the DIV12 signal arrives after six raw clock cycles. In the example shown in FIG. 6, however, where two clock cycles are to be borrowed, the output DIV12<3> of the fourth flip-flop 614 may be used to drive the clock divider circuit 620, effectively scheduling arrival of the first transition of the DIV48 signal after only four raw clock cycles instead of six.

Further describing the clock divider circuit, a first divide-by-2 counter 621 of the series is configured to accept the DIV12<3> signal as its clock input. Counter 621 takes as its data input, D, the complement of its output, $Q_n$. As shown, the first counter 621 may generally be configured generate an output, Q, upon triggering by a trailing edge of the DIV12<3> signal. The output, Q, which has a frequency half that of the DIV12 input is shown as DIV24pre may be set to a set or reset state irrespective of the input D or clock signal.

As shown, flip-flop 622 subsequently accepts the DIV24pre signal of the counter 621 as its input, D. Distinct from counter 621, flip-flop 622 reads the value of the input DIV24pre signal upon triggering of the raw clock signal. Thus, flip-flop 622 effectively latches the value of the DIV24pre signal in a synchronous fashion with the raw clock. This also has the effect of advancing the timing of the DIV24 signal by one clock cycle respective to the DIV24pre signal. The first edge of the DIV24 output of flip-flop 622 arrives immediately following the eleventh clock cycle.

A second divide-by-2 counter 623 is configured to accept the output of the flip-flop 622 as its clock. As shown, the counter 623 may be configured to generate an output, Q, upon triggering by a trailing edge of the DIV24 signal. Counter 623 divides the DIV24 signal in a similar fashion as counter 621, taking as its input, D, the complement, $Q_n$, of its output. As shown, the counter divides the DIV24 signal to generate a DIV48pre signal.

As shown, flip-flop 624 subsequently accepts the DIV48pre signal of the counter 622 as its input, D. Flip-flop 624 then reads the value of the input DIV48pre signal upon triggering of the raw clock signal and thus latches the value of the DIV48 counter in a synchronous fashion with the raw clock. This may result in the advancement of the timing of the DIV48 signal respective to the DIV48pre signal, again by one clock cycle. At this stage, since the clock divider circuit has advanced the timing of the output by a total of two cycles, the first edge of the DIV48 output of flip-flop 624 arrives immediately following the twenty-fourth clock cycle.

Figure 6C:
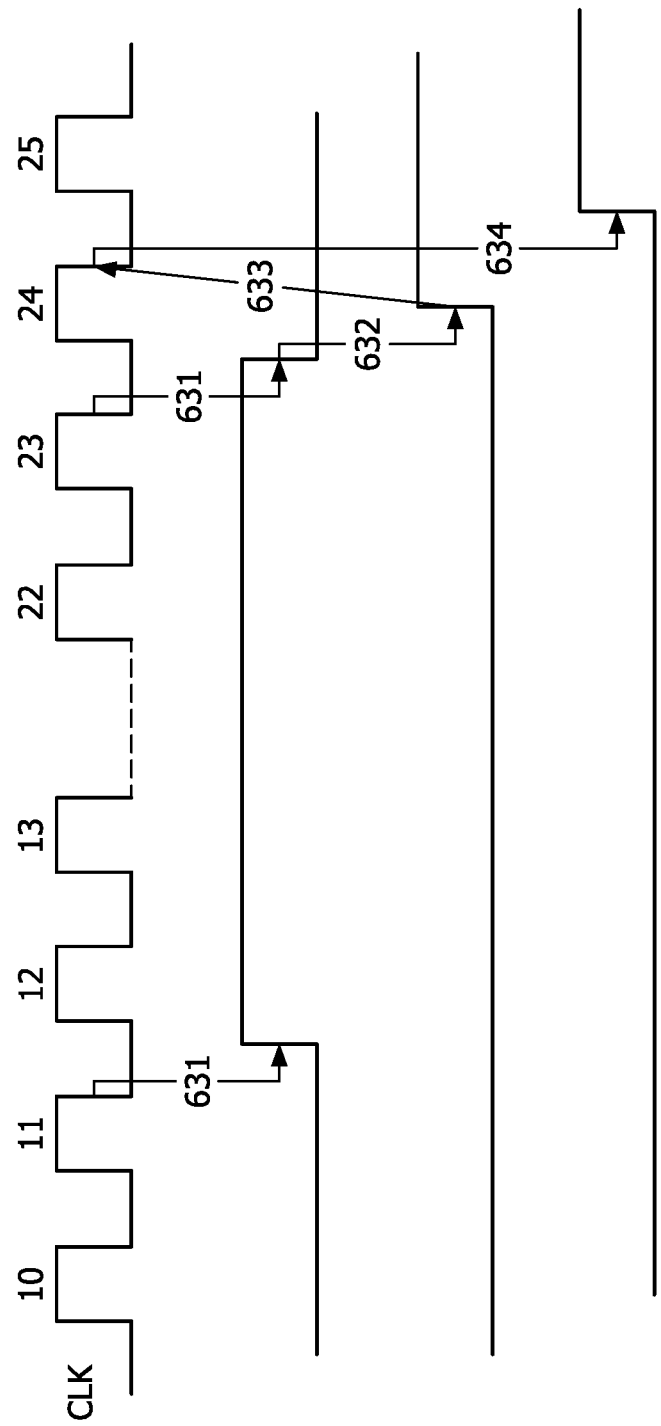
FIG. 6C is a timing diagram showing various signals generated by the asynchronous counter components described in FIGS. 6A and 6B.

FIG. 6C depicts, in greater detail, the timing of signals described in paragraphs above. The DIV24 signal output of flip-flop 622 may toggle upon a transition of the CLK signal. In embodiments, the transition may be a rising edge or a falling edge, as is shown. In generating the DIV24 signal, the flip-flop 622 may introduce delay 631 relative to a transition of the CLK. The delay 631 from the CLK transition to either a rising or falling edge of the DIV24 signal may be the same. Subsequently, the divide-by-2 counter 623 generates output DIV48pre from the DIV24 counter signal, introducing delay 632. At 633, however, flip-flop 624 samples the DIV48pre signal upon transitioning of the CLK, resulting in clock-to-output delay 634. The clock-to-output delay 634 may be the same as the clock to output delay 632. Though not depicted, it may be appreciated that the base borrowing clock signal DIV12 and the derivative counter signal DIV24pre may propagate in a similar fashion as the DIV24 and DIV48pre signals.

Figure 6D:
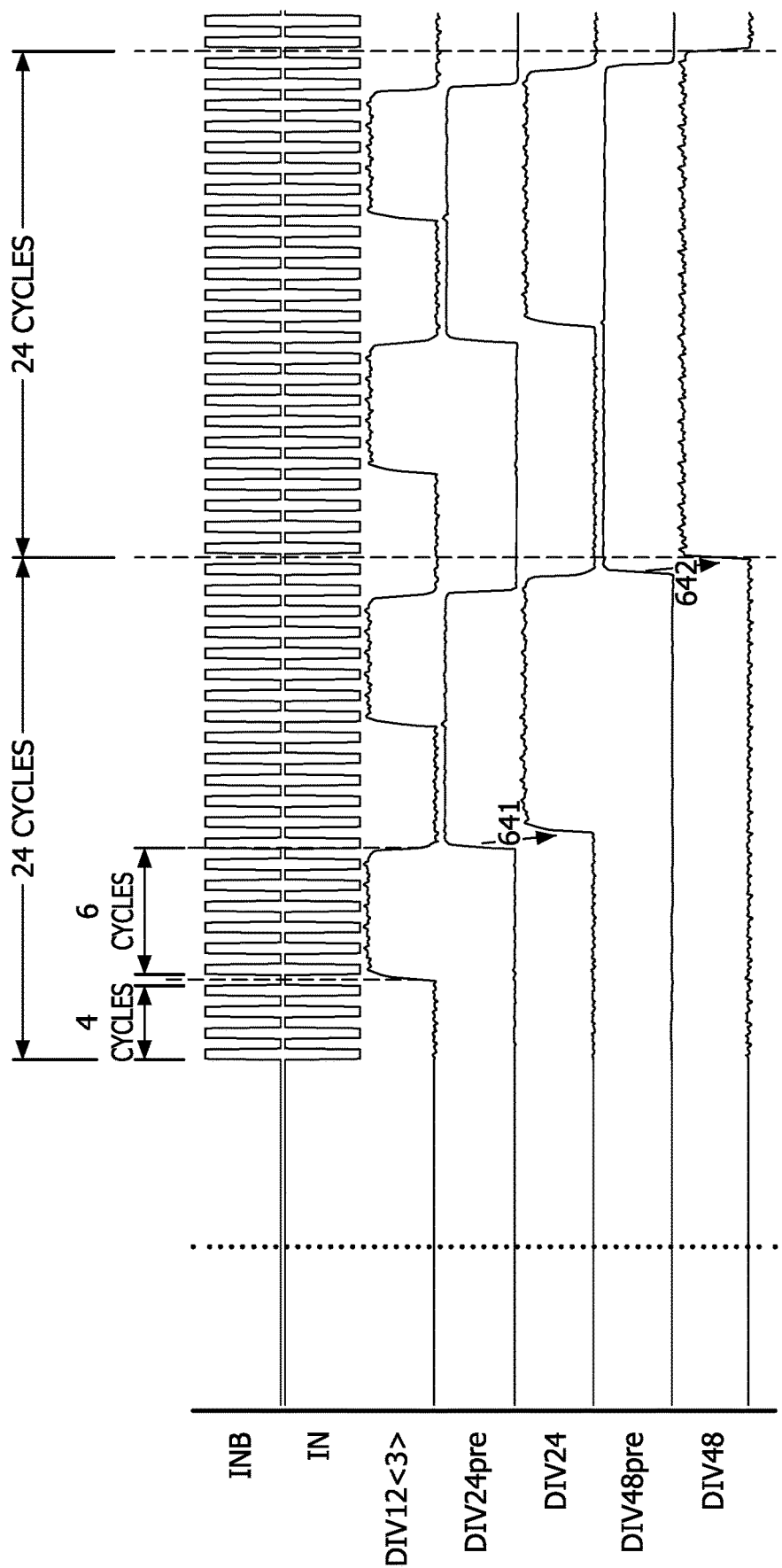
FIG. 6D is a chart displaying simulated waveforms for the signals generated by the asynchronous counter components described in FIGS. 6A and 6B.

FIG. 6D shows simulated waveforms for the signals described in paragraphs 6A through 6C. Signals INB and IN depict toggling of the raw differential clock input signal, CLK, as described above. As shown, INB and IN may be complementary signals. Also shown are the base borrowing clock signal DIV12<3>, the DIV24pre and DIV24 signals, and the DIV48pre and DIV48 signals. As can be seen, the DIV12<3> signal is modified to toggle from a low value to a high value after only four raw clock cycles instead of six, borrowing two clock cycles in preparation for the two subsequent stages of division.

641 and 642 depict clock-to-output delay introduced following the two stages of division. At 641, corresponding to the first of the two borrowed clock cycles, the timing of the DIV24 signal is advanced by one cycle respective to the DIV24pre signal as the value of the DIV24pre signal is read. As this occurs upon transitioning of the raw clock, the DIV24 output may have the same clock-to-output delay relative to the raw clock as would a synchronous divide-by-2 counter. Similarly, at 642, corresponding to the second of the two borrowed clock cycles, the timing of the DIV48 signal is again advanced by one cycle respective to the DIV48pre signal as the DIV48pre signal is read upon transitioning of the raw clock.

Figure 7A:
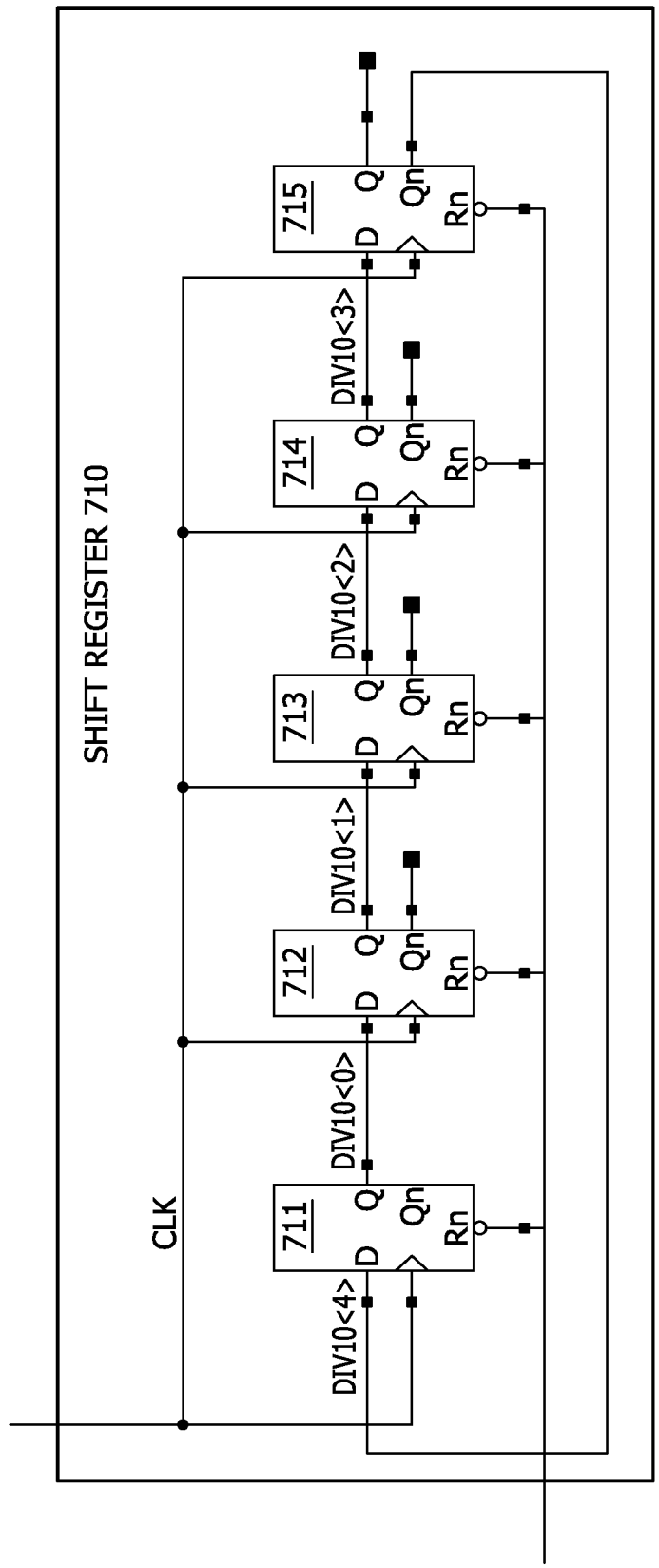
FIG. 7A is a circuit diagram of a shift register configured to generate a DIV12 base borrowing clock signal.

FIGS. 7A through 7D provide another example of an asynchronous counter circuit configured to generate a synchronous DIV160 counter signal. FIG. 7A shows a diagram of a shift register 710 configured to generate, from a raw clock signal, a DIV10 base borrowing clock signal. The shift register 710 may have a plurality of flip-flops 711, 712, 713, 714, and 715. As shown, each flip-flop may be driven by the raw clock signal CLK, and thus, their outputs may be said to be synchronous with one another. Each flip-flop may be a D-flip-flop configured with a binary input D and binary outputs Q and $Q_n$. The flip-flops may be arranged in a serial-input serial-output fashion such that each successive flip-flop takes the output Q of a previous flip-flop in the series as an input, D. As shown, each flip-flop of the shift register 710 may transfer input data D to its output Q on a rising edge of the clock signal CLK. Furthermore, the first flip-flop 711 of the series may also take the complement, $Q_n$, of the output of the final shift register 715 as its input D, as in a twisted ring or Johnson counter configuration. As shown, each flip-flop may also have a reset signal input, Rn, with which the output of the flip-flop may be set to a set or reset state irrespective of the input D or clock signal. In embodiments not depicted, each flip-flop may have an initialization input as an alternative to the reset signal input or in addition to the reset signal input.

It may be assumed that an initialized Q value for all flip-flops is 0. Starting on arrival of a first clock pulse, and continuing for the first five clock pulses, a $Q_n$ output of 1 may be fed from flip-flop 715 to the input of flip-flop 711. Upon arrival of a second clock pulse, flip-flop 711 may pass the output Q value 1 to the input D of flip-flop 712. Flip-flop 712 may subsequently pass the same to flip-flop 713 upon the third clock pulse, and flip-flops 714 and 715 may follow suit in a similar fashion. In this example, after five clock pulses, the value Q at all flip-flops is 1.

Starting upon arrival of a sixth clock pulse, and continuing until arrival of a tenth clock pulse, a $Q_n$ output of 0 may be fed from flip-flop 715 to the input of flip-flop 711. Advancement of the shift register may occur substantially as described above such that the pattern is repeated upon arrival of an eleventh clock pulse.

As may be observed, due to the cyclical nature of the twisted ring counter configuration, a series of n flip-flops may be used to generate a base borrowing clock with a period of 2n. In alternative embodiments, the shift register may have a straight serial configuration, instead simply passing the output of a first flip-flop to the next without cycling of the inputs from the final flip-flop of the series.

Figure 7B:
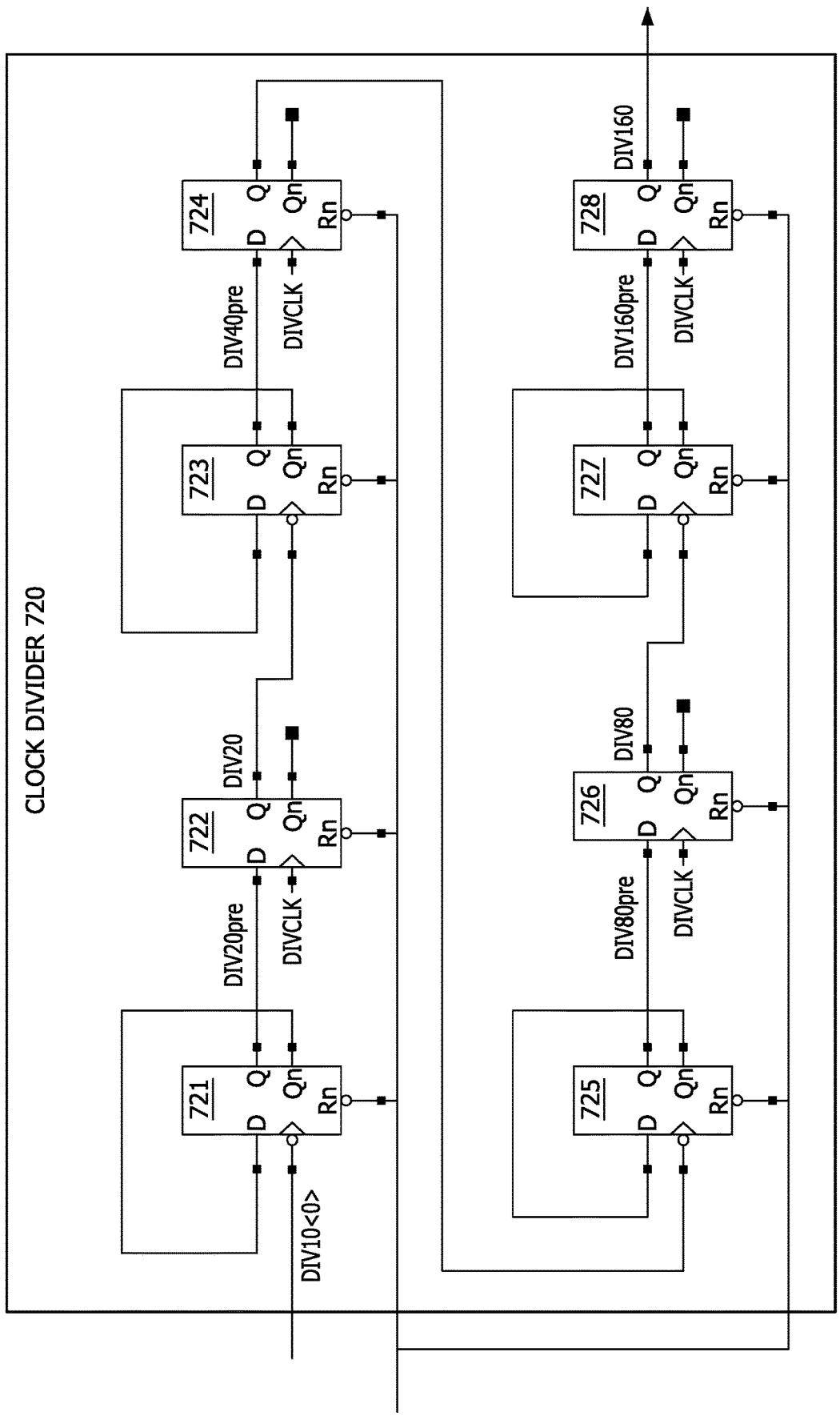
FIG. 7B is a circuit diagram of a clock divider circuit as may be configured to generate a DIV160 counter signal using a selected output of the shift register.

FIG. 7B further shows an example configuration of the clock divider circuit as may be configured to generate a DIV160 counter signal using a selected output of the shift register 710. Clock divider 720 may include a series of divide-by-2 counters 721, 723, 725, and 727, and flip-flops 722, 724, 726, and 728. In the examples given, it may be assumed that the clock-to-output delay for each stage of division is equal to or less than a length of one raw clock cycle. In embodiments as shown, the counters 721, 723, 725, and 727 and flips flops 722, 724, 726, and 728 may each have a reset signal input, Rn, and/or an initialization signal input with which their outputs may be set to a set or reset state irrespective of the input D or clock signal.

In order to adjust the timing of the final output signal of the asynchronous counter, the clock divider 720 may borrow cycles from the base borrowing clock generated by the shift register 710. Given that the shift register 710 generates a DIV10 signal and a DIV160 counter signal is desired, it may be determined that four divide-by-2 stages are needed. As each stage may introduce one instance of clock-to-output delay, four cycles may need to be borrowed. This may be accomplished, for example, by configuring the clock divider to accept an output signal of a particular flip-flop in the shift register. By default (i.e., where the DIV10 signal is to be used without borrowing) the output of the final flip-flop of the shift register may be used to drive the clock divider. For a DIV10 signal as shown, which has a period of ten raw clock cycles, the first transition of the DIV10 signal arrives after five raw clock cycles. In the example shown in FIG. 7, however, where two clock cycles are to be borrowed, the output DIV10<0> of the second flip-flop 712 may be used to drive the clock divider circuit 720, effectively scheduling arrival of the first transition of the DIV48 signal after only six raw clock cycles instead of ten.

Further describing the clock divider circuit, a first divide-by-2 counter 721 of the series is configured to accept the DIV10<0> signal as its clock input. Counter 721 takes as its data input, D, the complement of its output, $Q_n$. As shown, the first counter 721 may generally be configured to generate an output, Q, upon triggering by a trailing edge of the DIV10<0> signal. The output, Q, which has a frequency half that of the DIV10 input is shown as DIV20pre may be set to a set or reset state irrespective of the input D or clock signal.

As shown, flip-flop 722 subsequently accepts the DIV20pre signal of the counter 721 as its input, D. Distinct from counter 721, flip-flop 722 reads the value of the input DIV20pre signal upon triggering of the raw clock signal. Thus, flip-flop 722 effectively latches the value of the DIV20pre counter in a synchronous fashion with the raw clock. The timing of the DIV20 signal is advanced by one clock cycle respective to the DIV20pre signal. The first edge of the DIV20 output of flip-flop 722 arrives immediately following the seventh clock cycle.

The following two stages of division performed by counters 723 and 725 and flip-flops 724 and 726 may be carried out in a similar fashion as described for counter 721 and flip-flop 722 above.

A fourth and final divide-by-2 counter 727 is configured to accept the output of the flip-flop 726 as its clock. As shown, the counter 727 may be configured to generate an output, Q, upon triggering by a trailing edge of the DIV80 signal. Counter 727 divides the DIV80 signal in a similar fashion as counters 721, 723, and 725, taking as its input, D, the complement, $Q_n$, of its output. As shown, the counter divides the DIV80 signal to generate a DIV160pre signal.

As shown, the fourth and final flip-flop 728 subsequently accepts the DIV160pre signal of the counter 727 as its input, D. Flip-flop 728 then reads the value of the input DIV160pre signal upon triggering of the raw clock signal and thus latches the value in a synchronous fashion with the raw clock. Corresponding to the fourth of the four cycles borrowed from the base borrowing clock, the DIV160 signal is advanced by one clock cycle respective to the DIV160pre signal, such that the first edge of the DIV160 output of flip-flop 728 arrives immediately following the eighteenth clock cycle.

Figure 7C:
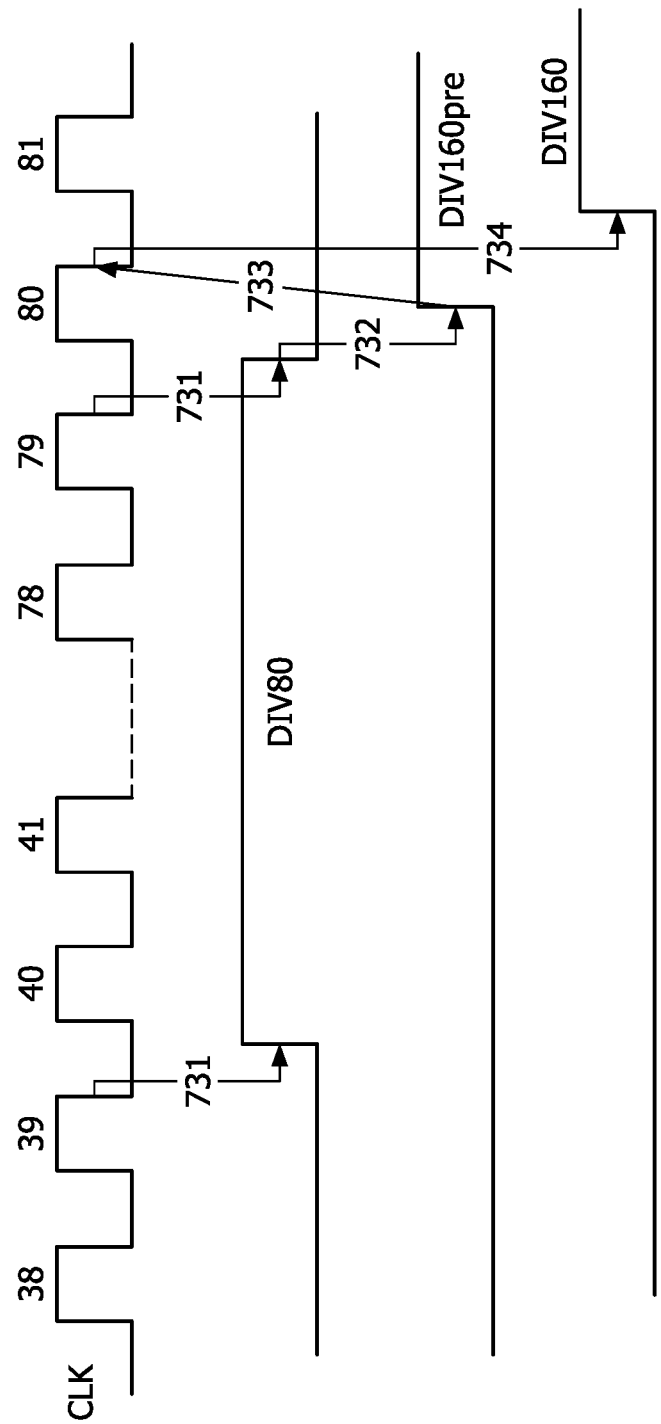
FIG. 7C is a timing diagram showing various signals generated by the asynchronous counter components described in FIGS. 6A and 6B.

FIG. 7C depicts, in greater detail, the timing of signals described in paragraphs above. The DIV20 signal output of flip-flop 722 may toggle upon a transition of the CLK signal. In embodiments, the transition may be a rising edge or a falling edge, as is shown. In generating the DIV20 signal, the flip-flop 722 may introduce delay 731 relative to a transition of the CLK. The delay 731 from the CLK transition to either a rising or falling edge of the DIV20 signal may be the same. Subsequently, the divide-by-2 counter 723 generates output DIV40pre from the DIV20 counter signal, introducing delay 732. At 733, however, flip-flop 724 samples the DIV40pre signal upon transitioning of the CLK, resulting in clock-to-output delay 734. The clock-to-output delay 734 may be the same as, or similar to the clock to output delay 732. Though not depicted, it may be appreciated that the base borrowing clock signal DIV10, the derivative counter signals DIV20pre, DIV20, DIV40pre, and DIV40 may propagate in a similar fashion as the DIV80 and DIV160pre signals.

Figure 7D:
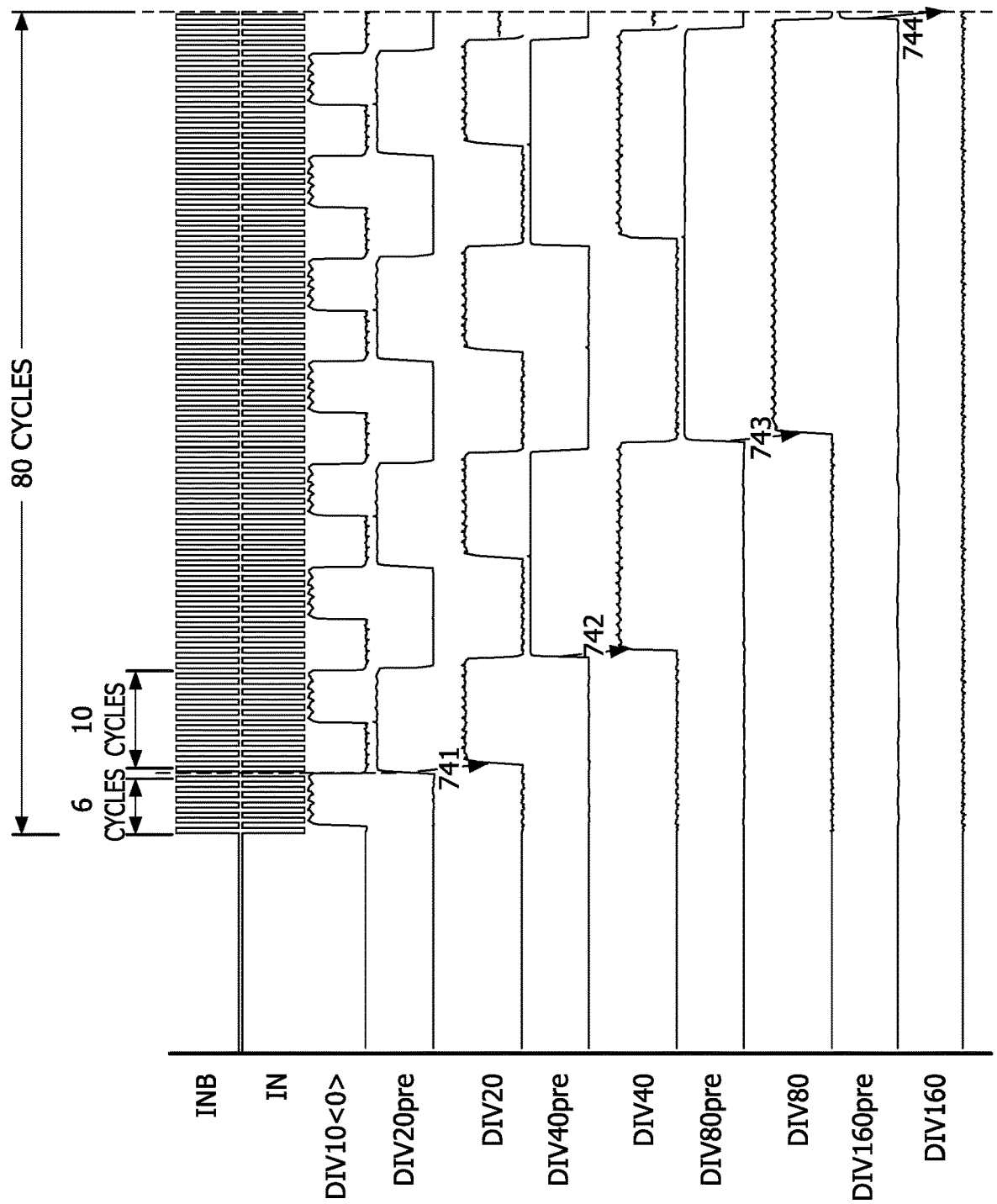
FIG. 7D is a chart displaying simulated waveforms for the signals generated by the asynchronous counter components described in FIGS. 6A and 6B.

FIG. 7D shows simulated waveforms for the signals described in paragraphs 7A through 7C. Signals INB and IN depict toggling of the raw differential clock input signal, CLK, as described above. As shown, INB and IN may be complementary signals. Also shown are the base borrowing clock signal DIV10<0>, the DIV20pre and DIV20 signals, the DIV40pre and DIV40, the DIV80pre and DIV80 signals, and the DIV160pre and DIV160 signals. As can be seen, the DIV10<0> signal is modified to toggle from a low value to a high value after only six raw clock cycles instead of ten, borrowing four clock cycles in preparation for the four subsequent stages of division.

741, 742, 743, and 744 depict clock-to-output delay introduced following the four stages of division. At 741, corresponding to the first of the four borrowed clock cycles, the timing of the DIV20 signal is advanced by one clock cycle respective to the DIV20pre signal as the value of the DIV20pre signal is read. As this occurs upon transitioning of the raw clock, the DIV20 output may have the same clock-to-output delay relative to the raw clock as would an output of a synchronous divide-by-2 counter. At 742, 743, and 744, corresponding to the remaining three borrowed clock cycles, the timing of the DIV40, DIV80, and DIV160 signals are each advanced by one clock cycle in a similar fashion with respect to the DIV40pre, DIV80pre, and DIV160pre signals.

Although features and elements are described above in particular combinations, one of ordinary skill in the art will appreciate that each feature or element can be used alone or in any combination with the other features and elements.

What is claimed is:
1. An asynchronous counter circuit comprising:
   a shift register comprising a series of flip-flops, wherein each of the flip-flops of the series is coupled to a clock, wherein the shift register generates a borrowing clock signal using an output of a flip-flop of the shift register, wherein a transition of the borrowing clock signal is advanced by a number of clock cycles based on a position of the flip-flop of the shift register; and
   a clock divider circuit comprising a number of divide-by-N counters and a number of flip-flops, wherein a divide-by-N counter is coupled to a flip-flop of the shift register, and wherein a flip-flop of the clock divider circuit is coupled to one of the divide-by-N counters and to the clock.

2. The asynchronous counter circuit of claim 1, wherein an output signal of the clock divider circuit is synchronous with the clock.

3. The asynchronous counter circuit of claim 2, coupled to one or more logic gates, wherein the one or more logic gates are configured to gate an output of the borrowing clock signal using the output signal of the clock divider circuit.

4. The asynchronous counter circuit of claim 1, wherein the number of divide-by-N counters is the same as the number of clock signal cycles.

5. The asynchronous counter circuit of claim 1, wherein the divide-by-N counters and flip-flops of the clock divider circuit are arranged in an alternating series, wherein the alternating series begins with one of the divide-by-N counters.

6. The asynchronous counter circuit of claim 1, wherein the series of flip-flops of the shift register is arranged in a twisted ring-counter configuration.

7. The asynchronous counter circuit of claim 1, wherein the number of divide-by-N counters and the number of flip-flops of the clock divider circuit are the same.

8. The asynchronous counter circuit of claim 1, wherein each of the divide-by-N counters of the clock divider circuit are divide-by-2 counters, and wherein each of the divide-by-2 counters accept, as a data signal input, a complement of their output signals.

9. The asynchronous counter circuit of claim 1, wherein the shift register generates a plurality of borrowing clock signals using an output of each of a plurality of flip-flops of the shift register, and wherein, for each of the borrowing clock signals, a transition of a borrowing clock signal is advanced by a number of clock cycles based on a position of a flip-flop of the shift register.

10. The asynchronous counter circuit of claim 1, wherein the divide-by-N counters and flip-flops of the clock divider circuit are arranged in a plurality of alternating series, each of the alternating series starting with a first divide-by-N counter, wherein the first divide-by-N counter in each of the alternating series is coupled to a different flip-flop of the shift register, and wherein a final flip-flop in each of the alternating series of the clock divider circuit is coupled to a preceding divide-by-N counter in each of the alternating series and to the clock.

11. The asynchronous counter circuit of claim 1, wherein the shift register and clock divider circuit further comprise initialization and enable input terminals.

12. An asynchronous counter circuit comprising:
   means for generating a borrowing clock signal based on a clock signal, wherein a transition of the borrowing clock signal is advanced by a number of clock signal cycles;
   means for dividing the borrowing clock signal in a number of successive division stages to generate a counter output signal; and
   means for sampling, at a transition of the clock signal, the counter output signal.

13. The asynchronous counter circuit of claim 12, wherein the means for sampling the counter output signal is configured to generate another counter output signal that is synchronous with the clock signal.

14. The asynchronous counter circuit of claim 12, wherein the number of successive division stages is the same as the number of clock signal cycles.

15. The asynchronous counter circuit of claim 12, further comprising means for sampling the divided borrowing clock signal for each of the number of successive division stages.

16. The asynchronous counter circuit of claim 12, further comprising means for generating a plurality of borrowing clock signals using the clock signal and advancing, for each of the borrowing clock signals, a transition of a borrowing clock signal by a number of clock signal cycles.

17. The asynchronous counter circuit of claim 12, further comprising means for dividing the borrowing clock signal in a number of successive division stages to generate a plurality of counter output signals and means for sampling each of the counter output signals at a transition of the clock signal.

18. A system comprising:
   a counter circuit configured to receive a clock signal;
   a series of logic gates configured to receive the clock signal and an output signal of the counter circuit; and
   an adjustable delay circuit configured to receive an output of the series of logic gates.

19. The circuit of claim 18, wherein the counter circuit is an asynchronous counter circuit, and wherein the output signal of the asynchronous counter circuit and the clock signal are synchronous.

20. The circuit of claim 18, wherein the counter circuit is a synchronous counter circuit, wherein the series of logic gates is configured to receive the clock signal via a delay chain, and wherein the delay chain and the synchronous counter circuit introduce a same amount of propagation delay to the clock signal.

21. The circuit of claim 18, wherein the series of logic gates is configured to gate the clock signal using the output signal of the counter circuit.

22. The circuit of claim 21, further comprising a data input block configured to receive an output of the adjustable delay circuit and a data input signal, wherein the data input block is configured to adjust the clock signal based on the output of the adjustable delay circuit and to sample a pulse of the data input signal at a transition of the adjusted clock signal.

* * * * *